(12) United States Patent
Kim et al.

(10) Patent No.: US 12,542,262 B2
(45) Date of Patent: Feb. 3, 2026

(54) APPARATUS FOR TREATING SUBSTRATE AND METHOD FOR TREATING SUBSTRATE

(71) Applicant: SEMES CO., LTD., Cheonan-si (KR)

(72) Inventors: Dong-Hun Kim, Seoul (KR); Jun Taek Koo, Seoul (KR); Myoung Sub Noh, Hwaseong-si (KR); Dong Sub Oh, Busan (KR)

(73) Assignee: Semes Co., Ltd., Chungcheongnam-do (KR)

( * ) Notice: Subject to any disclaimer, the term of this patent is extended or adjusted under 35 U.S.C. 154(b) by 743 days.

(21) Appl. No.: 17/977,440

(22) Filed: Oct. 31, 2022

(65) Prior Publication Data

US 2023/0136707 A1 May 4, 2023

(30) Foreign Application Priority Data

Nov. 2, 2021 (KR) .................. 10-2021-0148452

(51) Int. Cl.
*H01J 37/32* (2006.01)
*G02B 27/28* (2006.01)

(52) U.S. Cl.
CPC ...... *H01J 37/32917* (2013.01); *G02B 27/283* (2013.01); *H01J 37/32422* (2013.01); *H01J 37/32568* (2013.01)

(58) Field of Classification Search
CPC ............. G02B 27/283; H01J 37/32091; H01J 37/32357; H01J 37/32422; H01J 37/3244; H01J 37/32449; H01J 37/32568; H01J 37/32715; H01J 37/32917; H01J 37/32935; H01J 37/32972

See application file for complete search history.

(56) References Cited

U.S. PATENT DOCUMENTS

| 9,793,126 | B2 | 10/2017 | Dhindsa et al. |
| 10,297,459 | B2 | 5/2019 | Hudson et al. |
| 10,304,693 | B2 | 5/2019 | Hudson |

(Continued)

FOREIGN PATENT DOCUMENTS

| CN | 104465457 A | 3/2015 |
| JP | 2015-065434 A | 4/2015 |

(Continued)

OTHER PUBLICATIONS

Chinese Office Action dated Jun. 13, 2025 issued in corresponding Chinese Patent Appln. No. 202211364471.1.

(Continued)

*Primary Examiner* — Benjamin Kendall
(74) *Attorney, Agent, or Firm* — Harness, Dickey & Pierce, P.L.C.

(57) ABSTRACT

The inventive concept provides a substrate treating apparatus. The substrate treating apparatus includes a housing having an inner space; a plate separating the inner space into a first space which is above and a second space which is below and having a plurality of through holes; a first gas supply unit configured to supply a first gas to the first space; a plasma source for generating a plasma at the first space or the second space; and a monitoring unit installed at the plate and configured to monitor a characteristic of the plasma generated at the first space or the second space.

14 Claims, 12 Drawing Sheets

(56) References Cited

U.S. PATENT DOCUMENTS

| | | |
|---|---|---|
| 10,373,840 B2 | 8/2019 | Hudson et al. |
| 10,553,399 B2 | 2/2020 | Marakhtanov et al. |
| 11,670,486 B2 | 6/2023 | Marakhtanov et al. |
| 2007/0039548 A1* | 2/2007 | Johnson ............. G01B 11/0658 118/665 |
| 2009/0218314 A1* | 9/2009 | Davis ................ H01J 37/32935 385/115 |
| 2014/0057447 A1 | 2/2014 | Yang et al. |
| 2016/0240402 A1* | 8/2016 | Park .................. H01J 37/32532 |
| 2019/0006157 A1* | 1/2019 | O'Banion ......... H01L 21/67109 |
| 2019/0019734 A1* | 1/2019 | Jung ....................... G01N 21/31 |
| 2019/0043699 A1* | 2/2019 | Cho .................. H01J 37/32798 |
| 2021/0111008 A1 | 4/2021 | Itoh |
| 2023/0317412 A1 | 10/2023 | Marakhtanov et al. |

FOREIGN PATENT DOCUMENTS

| | | |
|---|---|---|
| KR | 2004-0009959 A | 1/2004 |
| KR | 2015-0032811 A | 3/2015 |
| KR | 102019415 B1 | 9/2019 |
| WO | WO-2014049915 A1 | 4/2014 |

OTHER PUBLICATIONS

Korean Office Action dated May 8, 2025 issued in corresponding Korean Patent Appln. No. 10-2021-0148452.
Japanese Office Action dated Oct. 10, 2023 issued in Japanese Patent Application No. 2022-175272.

* cited by examiner

APPARATUS FOR TREATING SUBSTRATE AND METHOD FOR TREATING SUBSTRATE

CROSS-REFERENCE TO RELATED APPLICATIONS

A claim for priority under 35 U.S.C. § 119 is made to Korean Patent Application No. 10-2021-0148452 filed on Nov. 2, 2021, in the Korean Intellectual Property Office, the entire contents of which are hereby incorporated by reference.

BACKGROUND

Embodiments of the inventive concept described herein relate to a substrate treating apparatus and a substrate treating method, more specifically, a substrate treating apparatus and a method for treating a substrate with a plasma.

A plasma refers to an ionized gas state composed of ions, radicals, and electrons. The plasma is produced by a very high temperatures, a strong electric field, or a high frequency electromagnetic field (RF electromagnetic field). A semiconductor device manufacturing process may include an etching process of removing a thin film or by-products formed on a substrate such as a wafer using the plasma. The etching process is performed by colliding ions and/or radicals of the plasma with the thin film on the substrate or reacting with the thin film.

In a process of treating the substrate, it is important that characteristics of the plasma are kept constant. If the characteristics of the plasma are changed, it is difficult to satisfy process treatment conditions required for the substrate. This causes a process defect of the substrate and leads to a problem of lowering a process efficiency In general, an observation window is installed on a side wall of the chamber to observe plasma characteristics such as a color of the plasma and a distribution of the plasma. The observation window is contaminated by particles, process by-products, etc. generated while performing the process, thereby interfering with an observation of plasma characteristics. Furthermore, a method of monitoring high-frequency voltages or high-frequency currents to observe the properties of the plasma do not provide an accurate information about the plasma distributed over a wide range. In addition, in a process of using multiple plasma with different characteristics in multiple areas inside the chamber, a plurality of observation equipment is required to observe each plasma. This makes an apparatus structurally complex and reduces a spatial efficiency of by the apparatus.

SUMMARY

Embodiments of the inventive concept provide a substrate treating apparatus and a substrate treating method for observing characteristics of a plasma.

Embodiments of the inventive concept provide a substrate treating apparatus and a substrate treating method for observing characteristics of each plasma using one observing equipment which can observe a plural number of plasmas having different characteristics.

Embodiments of the inventive concept provide a substrate treating apparatus and a substrate treating method for observing characteristics of a plasma without an additional structure change of an apparatus.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing having an inner space; a plate separating the inner space into a first space which is above and a second space which is below and having a plurality of through holes; a first gas supply unit configured to supply a first gas to the first space; a plasma source for generating a plasma at the first space or the second space; and a monitoring unit installed at the plate and configured to monitor a characteristic of the plasma generated at the first space or the second space.

In an embodiment, an optical path connecting the first space or the second space, and the monitoring unit is formed at the plate.

In an embodiment, the plasma source includes: a first electrode applied with a first high frequency power and generating a first plasma at the first space; and a second electrode applied with a second high frequency power and generating a second plasma at the second space, and wherein the optical path has a first path which penetrates the plate in an up/down direction and a second path which connects to the first path and extends in a direction toward a side wall of the plate.

In an embodiment, the monitoring unit includes a polarizing plate installed at a position at which the first path and the second path intersect, and which has a polarization direction in a first direction, the light includes a first polarization which vibrates in the first direction and a second polarization which vibrates in a second direction which is different from the first direction, and the polarization plate is formed inclined with respect to the first path so the second polarization among the light incident to the first path is reflected from the polarizing plate to face a direction parallel to the second path.

In an embodiment, the monitoring unit further includes: a receiving member installed at a side of the second path which is adjacent to the side wall and which receives the light; and a refraction member installed at the other side facing a side of the second path and which changes a characteristic of the second polarization so the second polarization which is reflected from the polarizing plate vibrates in the first direction.

In an embodiment, the monitoring unit further includes a reflective member installed on the first path and which reflects the light which is incident from the first path to the second path.

In an embodiment, a transparent cover is further installed at each of an end and the other end of the first path at the monitoring unit.

In an embodiment, the plate is grounded and captures ions included in a plasma generated in the first space to supply radicals to the second space.

The inventive concept provides a substrate treating apparatus. The substrate treating apparatus includes a housing having a plasma region and a substrate treating region; a plate separating the plasma region and the substrate treating region and having a plurality of through holes; a first gas supply unit configured to supply a gas to the plasma region; a plasma source for generating a plasma at the plasma region; and a monitoring unit installed at the plate and configured to monitor a characteristic of the plasma generated at the plasma region.

In an embodiment, an optical path is formed connecting the plasma region or the substrate treating region, and the monitoring unit at the plate.

In an embodiment, the optical path has a first path which penetrates the plate in an up/down direction and a second path which connects to the first path and extends in a direction toward a side wall of the plate.

In an embodiment, the monitoring unit includes a polarizing plate installed at a position at which the first path and the second path intersect, and which has a polarization direction in a first direction, the light includes a first polarization which vibrates in the first direction and a second polarization which vibrates in a second direction which is different from the first direction, and the polarization plate is formed inclined with respect to the first path so the second polarization among the light incident to the first path is reflected from the polarizing plate to face a direction parallel to the second path.

In an embodiment, the monitoring unit includes a reflective member plate installed at a position at which the first path and the second path intersect, and which reflects the light incident to the first path in a direction of the second path.

In an embodiment, a transparent cover is further installed at each of an end and the other end of the first path at the monitoring unit.

The inventive concept provides a substrate treating apparatus. The substrate treating apparatus includes a housing having a treating space; an ion blocker dividing the treating space and a plasma space and which is grounded; a first gas supply unit configured to supply a first gas to the treating space; a second gas supply unit configured to supply a second gas to the plasma space; a top electrode positioned above the ion blocker and facing the ion blocker, which connects with a top source to be applied with a high frequency power, and which excites a first gas to generate a first plasma at a plasma space; a bottom electrode positioned below the ion blocker and facing the ion blocker, which excites the second gas to generate a second plasma at the treating space; and a monitoring unit configured to monitor a characteristic of the first plasma generated at the treating space and/or the second plasma generated at the plasma space, and wherein the monitoring unit is installed at the ion blocker, an optical path which connects the treating space or the plasma space, and the monitoring unit is formed at the ion blocker, and the optical path has a first path which penetrates the ion blocker in an up/down direction and a second path which connects to the first path and extends in a direction toward a side wall of the ion blocker.

In an embodiment, the monitoring unit includes a polarizing plate installed at a position at which the first path and the second path intersect, and which has a polarization direction in a first direction, the light includes a first polarization which vibrates in the first direction and a second polarization which vibrates in a second direction which is different from the first direction, and the polarization plate is formed inclined with respect to the first path so the second polarization among the light incident to the first path is reflected from the polarizing plate to face a direction parallel to the second path.

In an embodiment, the monitoring unit further includes: a receiving member installed at a side of the second path which is adjacent to the side wall and which receives the light; and a refraction member installed at the other side facing a side of the second path and which changes a characteristic of the second polarization so the second polarization which is reflected from the polarizing plate vibrates in the first direction.

In an embodiment, the monitoring unit further includes a reflective member installed on the first path and which reflects the light which is incident from the first path to the second path.

The inventive concept provides a substrate treating method for treating a substrate at a process chamber having a first space and a second space which is divided from the first space. The substrate treating method includes a treating using a first plasma in a state at which ions are removed at a second space, while the first space and the second space is divided by a plate and a first plasma which includes an ion formed at the first space flows from the first space to the second plate, and a monitoring of a characteristic of a first plasma which is generated at the first space by a monitoring unit installed at the plate.

In an embodiment, an optical path is formed at the monitoring unit connecting the first space or the second space, and the monitoring unit, and the optical path has a first path which penetrates the plate in an up/down direction and a second path which connects to the first path and extends in a direction toward a side wall of the plate.

In an embodiment, at the treating using the first plasma, the light emitted from the first plasma at the first space is incident to above the first path, a portion of the light incident to the first path passes the polarizing plate installed on the first path to reach the second space, and the other portion of the light incident to the first path is reflected from the polarizing plate and incident to the second path.

In an embodiment, the substrate treating method further includes a treating using a second plasma including ions formed at the second space.

In an embodiment, at the treating using the second plasma, the light emitted from the second plasma is incident to below the first path, a portion of the light incident to the first path passes a polarizing plate installed on the first path to reach the first space, another portion of the light incident to the first path is reflected from the polarizing plate and then reflected again from a refractive member which changes a characteristic of a polarization to change a characteristic of the polarization, and the light having a changed characteristic passes the polarizing plate to be incident to the second path.

In an embodiment, at the treating using the first plasma, the light emitted from the first plasma is incident to above the first path, the light incident to the first path is reflected by a reflective member installed on the first path to be incident to the second path, and at the treating using the second plasma, the light emitted from the second plasma is incident to below the first path, and the light incident to the first path is reflected from the reflective member installed on the first path to be incident to the second path.

According to an embodiment of the inventive concept, characteristics of a plasma may be effectively observed.

According to an embodiment of the inventive concept, characteristics of each plasma may be observed using one observing equipment which can observe a plural number of plasmas having different characteristics.

According to an embodiment of the inventive concept, characteristics of a plasma may be observed without an additional structure change of an apparatus.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
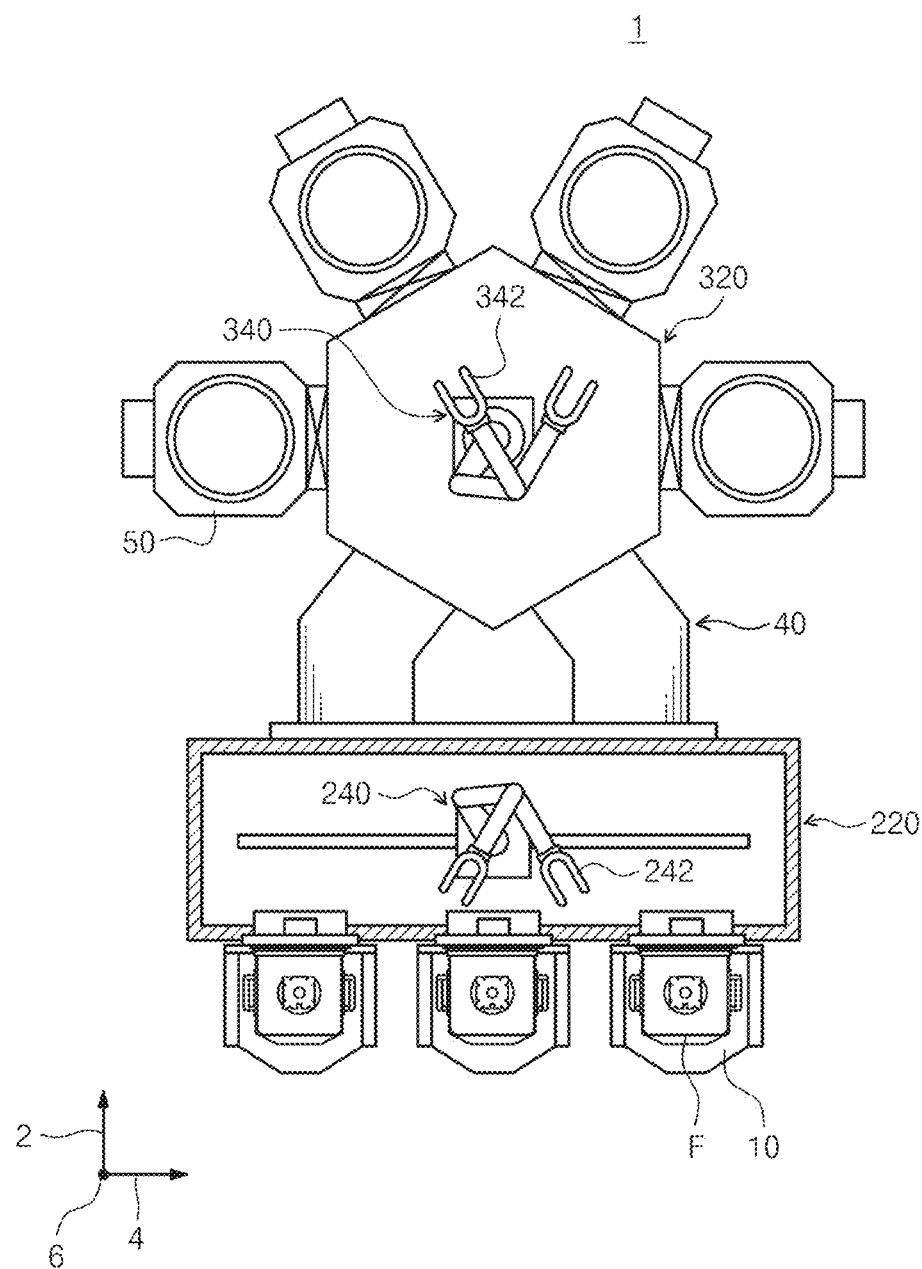
FIG. 1 schematically illustrates a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, an embodiment of the inventive concept will be described in detail with reference to FIG. 1 to FIG. 13.

FIG. 1 schematically illustrates a substrate treating apparatus according to an embodiment of the inventive concept. Referring to FIG. 1, the substrate treating apparatus 1 according to an embodiment of the inventive concept may include a load port 10, an atmospheric pressure transfer module 20, a vacuum transfer module 30, a load lock chamber 40, and a process chamber 50.

The load port 10 may be disposed on a side of the atmospheric pressure transfer module 20 to be described later. One or more load ports 10 may be provided. The number of load ports 10 may increase or decrease according to a process efficiency, foot print conditions, and the like. A container F according to an embodiment of the inventive concept may be placed in the load port 10. The container F may be loaded onto or unloaded from the load port 10 by a transfer means (not shown) such as an overhead transfer apparatus (OHT), an overhead conveyor, or an automatic guided vehicle, or by an operator. The container F may include various types of containers according to a type of an article to be stored. As the container F, an airtight container such as a front opening integrated pod (FOUP) may be used.

The atmospheric pressure transfer module 20 and the vacuum transfer module 30 may be arranged in a first direction 2. Hereinafter, when viewed from above, a direction perpendicular to the first direction 2 is defined as a second direction 4. In addition, a direction perpendicular to a plane including both the first direction 2 and the second direction 4 is defined as a third direction 6. Here, the third direction 6 is a direction perpendicular to the ground.

The atmospheric pressure transfer module 20 may selectively transfer the substrate W between the container F and the load lock chamber 40 to be described later. For example, the atmospheric pressure transfer module 20 may take out the substrate W from the container F and transfer the substrate W to the load lock chamber 40, or may take out the substrate W from the load lock chamber 40 and transfer the substrate W to the container F. The atmospheric pressure transfer module 20 may include a transfer frame 220 and a first transfer robot 240. The transfer frame 220 may be provided between the load port 10 and the load lock chamber 40. That is, the load port 10 may be connected to the transfer frame 220. The transfer frame 220 may be provided with an atmospheric pressure therein. An inside of the transfer frame 220 may be maintained in an atmospheric pressure atmosphere.

The transfer frame 220 may be provided with a first transfer robot 240. The first transfer robot 240 may selectively transfer the substrate W between the container F seated on the load port 10 and the load lock chamber 40 to be described later.

The first transfer robot 240 may move in a up/down direction. The first transfer robot 240 may have a first transfer hand 242 that moves forwardly, backwardly, or rotates on a horizontal plane. One or a plurality of first transfer hands 242 of the first transfer robot 240 may be provided. The substrate W may be placed on the first transfer hand 242.

The vacuum transfer module 30 may be disposed between a load lock chamber 40 to be described later and a process chamber 50 to be described later. The vacuum transfer module 30 may include a transfer chamber 320 and a second transfer robot 340.

The transfer chamber 320 may maintain an inner atmosphere as a vacuum pressure atmosphere. The transfer chamber 320 may be provided with a second transfer robot 340. In an embodiment, the second transfer robot 340 may be located in a central region of the transfer chamber 320. The second transfer robot 340 may selectively transfer the substrate W between the load lock chamber 40 and the process chamber 50. Selectively, the vacuum transfer module 30 may transfer the substrate W between the process chambers 50. The second transfer robot 340 may move in a horizontal and vertical direction. The second transfer robot 340 may have a second transfer hand 342 that moves forwardly, backwardly, or rotates on a horizontal plane. At least one second transfer hand 342 of the second transfer robot 340 may be provided.

At least one process chamber 50 to be described later may be connected to the transfer chamber 320. The transfer chamber 320 may be provided in a polygonal shape. A load lock chamber 40 and a process chamber 50 may be disposed around the transfer chamber 320. In an embodiment, as shown in FIG. 1, a hexagonal shaped transfer chamber 320 may be disposed at a central region of the vacuum transfer module 30, and a load lock chamber 40 and a process chamber 50 may be disposed around the transfer chamber 320. However, a shape of the transfer chamber 320 and the number of process chambers may be variously modified and provided according to the needs of a user.

The load lock chamber 40 may be disposed between the transfer frame 220 and the transfer chamber 320. The load lock chamber 40 provides a buffer space B in which the substrate W or the ring member R is exchanged between the transfer frame 220 and the transfer chamber 320.

As mentioned above, an inner atmosphere of the transfer frame 220 may be maintained in an atmospheric pressure atmosphere, and the inner atmosphere of the transfer chamber 320 may be maintained in a vacuum pressure atmosphere. The load lock chamber 40 is disposed between the transfer frame 220 and the transfer chamber 320, so that an inner atmosphere thereof may be converted between the atmospheric pressure atmosphere and a vacuum pressure atmosphere.

In an embodiment of the inventive concept, the process chamber 50 performs a process on the substrate W. The process chamber 50 treats the substrate W using a plasma. For example, the process chamber 50 may be a chamber performing an etching process of removing a thin film on the substrate W using the plasma, an ashing process of removing a photoresist film, a deposition process of forming a thin film on the substrate W, or a dry cleaning process. However, the inventive concept is not limited thereto, and a plasma treatment process performed at the substrate treating apparatus 10 may be variously modified to a known plasma treatment process.

Figure 2:
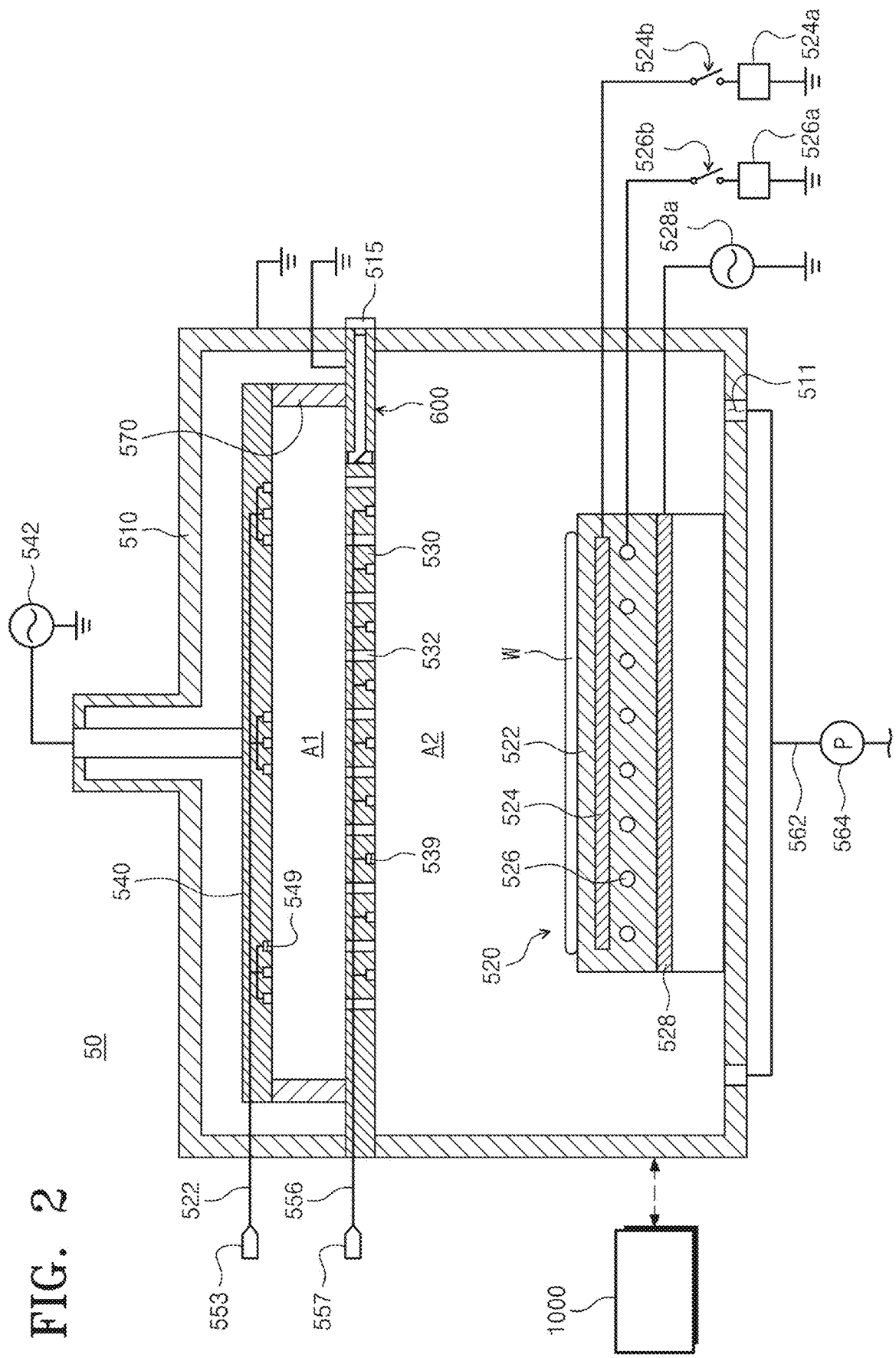
FIG. 2 schematically illustrates an embodiment of a process chamber of FIG. 1.

FIG. 2 schematically illustrates an embodiment of the process chamber of FIG. 1. Referring to FIG. 2, the process chamber 50 includes a housing 510, a chuck 520, a plate 530, a top electrode 540, a gas supply unit 550, an exhaust unit 560, and a monitoring unit 600.

The housing 100 may have an inner space. The inner space of the housing 100 may be divided into a top plasma space A1 and a bottom treating space A2 by the plate 530 to be described later. The plasma space A1 may be defined as a first space. The treating space A2 may be defined as a second space.

The plasma space A1 may be defined as a space in which the top electrode 540 and the plate 530 are combined with each other, which will be described later. The plasma space A1 may be provided as a space at which a first plasma P1 is generated. Specifically, the plasma space A1 may be provided as a space for exciting a first gas G1 supplied from the first gas supply unit 551, which will be described later, into the first plasma P1.

The treating space A2 may be defined as a space in which the plate 530 and the bottom electrode 528 are combined with each other, which will be described later. The treating space A2 may be provided as a space in which the substrate W is treated. Specifically, the treating space A2 may be provided as a space in which a radical from which ions included in the first plasma P1 have been removed and a second gas G2 supplied from a second gas supply unit 555, which will be described later, act on the substrate W. In addition, the treating space A2 may be provided as a space for exciting the second gas G2 supplied from the second gas supply unit 555 to the second plasma P2.

The housing 510 may be made of a metal material. The housing 510 is grounded. The housing 510 may be provided in a substantially cylindrical shape. A top electrode 540 to be described later may be disposed above the inner space of the housing 510. A chuck 520 to be described later may be disposed below the inner space of the housing 510. An exhaust hole 511 is formed on a bottom surface of the housing 510. An exhaust unit 560 to be described later may be connected to the exhaust hole 511.

On a side of the housing 510, the substrate W may be taken into the treating space A2, or an inlet (not shown) through which the substrate W is taken out from the treating space A2 may be formed. The inlet (not shown) may be selectively opened and closed by a door (not shown). A view port 515 may be installed on the other side of the housing 510. The view port 515 may observe a light incident from the monitoring unit 600 to be described later. The view port 515 communicates with an optical path D to be described later. For example, the view port 515 may communicate with a second path D2 to be described later.

The chuck 520 is located in the inner space of the housing 510. The chuck 520 supports the substrate W in the treating space A2. The chuck 520 may heat the substrate W. In addition, the chuck 520 may be an ESC capable of chucking the substrate W using an electrostatic force. The chuck 520 may include a support plate 522, an electrostatic electrode 524, a heater 526, and a bottom electrode 528.

The support plate 522 supports the substrate W. The support plate 522 has a support surface for supporting the substrate W. The substrate W is placed on the top surface of the support plate 522. The support plate 522 may be provided as a dielectric substrate. The support plate 522 may be provided as a dielectric having a disk shape. In an embodiment, the dielectric plate 520 may be made of a ceramic material. An electrostatic electrode 524 and a heater 546 may be buried in the support plate 522.

The electrostatic electrode 524 may be provided at a position overlapping the substrate W when viewed from above. The electrostatic electrode 524 may be disposed above the heater 546. The electrostatic electrode 524 is electrically connected to the first power source 524a. The first power source 524a may include a DC power. A first switch 524b is installed between the electrostatic electrode 524 and the first power source 524a. The electrostatic electrode 524 may be electrically connected to the first power source 524a by turning on/off of the first switch 524b. If the first switch 524b is turned on, a DC current is applied to the electrostatic electrode 524.

If a current is applied to the electrostatic electrode 524, an electric field by an electrostatic force capable of chucking the substrate W may be formed in the electrostatic electrode 524. The electric field may transmit a force chucked in a direction in which the substrate W faces the support plate 522. Accordingly, the substrate W is sucked to the support plate 522. In addition, the electric field may allow ions described later to flow straight toward the substrate W. That is, the electric field may allow the ions to have an anisotropy.

The heater 526 heats the substrate W. The heater 526 heats the substrate W by increasing a temperature of the support plate 522. The heater 526 is electrically connected to the second power source 526a. A second switch 526b is installed between the heater 526 and the second power supply 526a. The heater 526 may be electrically connected to the second power source 526a by turning on/off the second switch 526b. The heater 526 generates a heat by resisting a current applied from the second power source 526a. The generated heat is transferred to the substrate W through the support plate 522. The substrate W may be maintained at a predetermined temperature by the heat generated by the heater 526.

According to an embodiment, a plurality of heaters 526 may be provided as spiral coils. The heaters 526 may be provided in different regions of the support plate 522, respectively. For example, a heater 526 for heating a central region of the support plate 522 and a heater 526 for heating the edge region of the support plate 522 may be respectively provided, and these heaters 526 may independently adjust a degree of a heat generation. The heater 526 may be a heating element such as a tungsten.

In the above-described example, it has been described that the heater 526 is provided in the support plate 522, but the inventive concept is not limited thereto. The heater 526 may not be provided in the support plate 522.

The bottom electrode 528 may have a plate shape. In an embodiment, the bottom electrode 528 may be provided in a disk shape.

The bottom electrode 528 may be connected to a bottom power supply 528a. The bottom power supply 528a may apply a high frequency current to the bottom electrode 528. In an embodiment, the bottom power supply 528a may apply a second high frequency current to the bottom electrode 528. The bottom power supply 528a is provided as an RF source. In addition, a bottom impedance match (not shown) may be provided between the bottom electrode 528 and the bottom power supply 528a.

The bottom electrode 528 may be an electrode facing the plate 530 to be described later. The bottom electrode 528 may generate a plasma in the treating space A2. If a power is applied to the bottom electrode 528, the bottom electrode 528 forms an electric field in the treating space A2. The electric field formed in the treating space A2 may generate the second plasma P2 by exciting the second gas G2 supplied (inflowed) into the treating space A2. Accordingly, the bottom electrode 528 functions as a plasma source together with the top electrode 540 and the plate 530 to be described later.

The plate 530 may be disposed above the housing 510. The plate 530 may be disposed below the top electrode 540 to face the top electrode 540, which will be described later. The plate 530 is disposed between the chuck 520 and the top electrode 540. For example, the plate 530 may be disposed between the treating space A2 and the top electrode 540.

The plate 530 may be formed in a plate shape. The plate 530 may be connected to a sidewall of the housing 510. The plate 530 divides the inner space of the housing 510. The plate 530 divides the inner space of the housing 510 into a top plasma space A1 and a bottom treating space A2.

A plurality of through holes 532 may be formed in the plate 530. The plurality of through holes 532 may be formed as through holes vertically extending from a top end to a bottom end of the plate 530. The plurality of through holes 532 may fluidly communicate the top plasma space A1 to the bottom treating space A2.

The plate 530 may be grounded. The plate 530 may be grounded and function as an electrode facing each other with a top electrode 540 to be described later. The plate 530 and the top electrode 540 may form the first plasma P1 in the plasma space A1 by exciting the first gas G1 supplied from the first gas supply unit 551 to be described later. Accordingly, the plate 530 and the top electrode 540 may function as a first plasma source.

In addition, the plate 530 may be grounded and function as an electrode facing the bottom electrode 528. The plate 530 and the bottom electrode 528 may form a second plasma P2 in the treating space A2 by exciting the second gas G2 supplied from a second gas supply unit 555 to be described later. Accordingly, the plate 530 and the bottom electrode 528 may function as a second plasma source.

A second gas channel 539 may be formed on the plate 530. The second gas channel 539 may be connected to a second gas line 556 to be described later. The second gas channel 539 may supply the second gas G2 toward the treating space A2. A monitoring unit 600 to be described later may be provided on a side of the plate 530. An optical path D to be described later may be formed on a side of the plate 530.

The plate 530 may perform a function of an ion blocker. If the first plasma P1 generated in the plasma space A1 flows into the treating space A2, the plate 530 is grounded to remove ions contained in the first plasma P1. Specifically, the first gas G1 supplied to the plasma space A1 is decomposed into ions, electrons, and radicals as it is transferred to the first plasma state. As the first plasma passes through the plate 530, ions and electrons in the components of the first plasma are absorbed. That is, the plate 530 may function as a block ion blocker that blocks a passage of ions. Accordingly, only a radical among components included in the first plasma passes through the plate 530 and moves to the treating space A2.

The top electrode 540 may have a plate shape. In an embodiment, the top electrode 540 may have an area smaller than that of the plate 530 when viewed from above. However, the inventive concept is not limited thereto, and the top electrode 540 may have an area corresponding to that of the plate 530. The top electrode 540 may be positioned above the inner space of the housing 510. The top electrode 540 may be positioned above the plate 530. The top electrode 540 may be disposed to face the plate 530.

A top power source 542 may be connected to the top electrode 540. The top power source 542 may apply a high frequency current to the top electrode 540. In an embodiment, the top power source 542 may apply a first high frequency current to the top electrode 540. The top power source 542 is provided as an RF source. In addition, a top impedance match (not shown) may be provided between the top electrode 540 and the top power source 542.

The top electrode 540 may generate a plasma in the plasma space A1. The top electrode 540 may function as a plasma source. The top electrode 540 may be an electrode facing the plate 530. For example, the top electrode 540 may function as a first plasma source which generates a first plasma together with the plate 530. In an embodiment, if the power is applied to the top electrode 540, the top electrode 540 forms an electric field in the plasma space A1. An electric field formed in the plasma space A1 may generate the first plasma P1 by exciting the first gas G1 supplied (inflowed) into the plasma space A1.

A first gas inlet 549 may be formed in the top electrode 540. At least one first gas channel 549 may be provided. The first gas channel 549 may be connected to a first gas line 552 to be described later. The first gas channel 549 may supply the first gas G1 toward the plasma space A1.

The gas supply unit 550 supplies the first gas G1 and the second gas G2 to the inner space of the housing 510. The gas supply unit 550 may include a first gas supply unit 551 and a second gas supply unit 555.

The first gas supply unit 551 may supply the first gas G1 to the plasma space A1. For example, the first gas supply unit 551 may supply the first gas G1 to a space between the plate 530 and the top electrode 540. The first gas supply unit 551 may include a first gas line 552 and a first gas supply source 553.

The first gas line 552 connects the first gas channel 549 and the first gas supply source 553 to each other. An end of the first gas line 552 is connected to a plurality of first gas channels 549, and the other end of the first gas line 552 is connected to the first gas supply source 553. The first gas supply source 553 supplies the first gas G1 to the plasma space A1 through the first gas line 552. In an embodiment, the first gas G1 may be an $NH_3$. Optionally, the first gas G1 may further include one or more of an Ar or an He, or a multiple more.

The second gas supply unit 555 may supply the second gas G2 to the treating space A2. For example, the second gas supply unit 555 may supply the second gas G2 to a space between the plate 530 and the bottom electrode 528. The second gas supply unit 555 may include a second gas line 556 and a second gas supply source 557.

The second gas line 556 connects the second gas channel 539 and the second gas supply source 557 to each other. An end of the second gas line 556 is connected to a plurality of second gas channels 539, and the other end of the second gas line 556 is connected to the second gas supply source 557. The second gas supply source 557 supplies the second gas G2 to the treating space A2 through the second gas line 556. In an embodiment, the second gas G2 may be an $H_2$ or/and an $NH_3$.

The exhaust unit 560 may discharge a gas, process by-products, or the like flowing through the treating space A2. The exhaust unit 560 may adjust a pressure of the treating space A2. The exhaust unit 560 may include an exhaust line 562 and a depressurizing member 564. An end of the exhaust line 562 may be connected to the exhaust hole 511, and the other end of the exhaust line 562 may be connected to the depressurizing member 564. The depressurizing member 564 may be a pump. However, the inventive concept is not limited thereto, and may be variously modified and provided as a known device for providing a depressurizing.

The insulating member 570 may be disposed between the plate 530 and the top electrode 540. The insulating member 570 is provided with an insulating material. The insulating member 570 may have a ring shape when viewed from the top. The insulating member 570 may electrically insulate the plate 530 from the top electrode 540. A heating member (not shown) may be provided inside the insulating member 570 to transfer a heat to the plasma space A1. However, the inventive concept is not limited thereto, and a heating member (not shown) may not be provided inside the insulating member 570.

Figure 3:
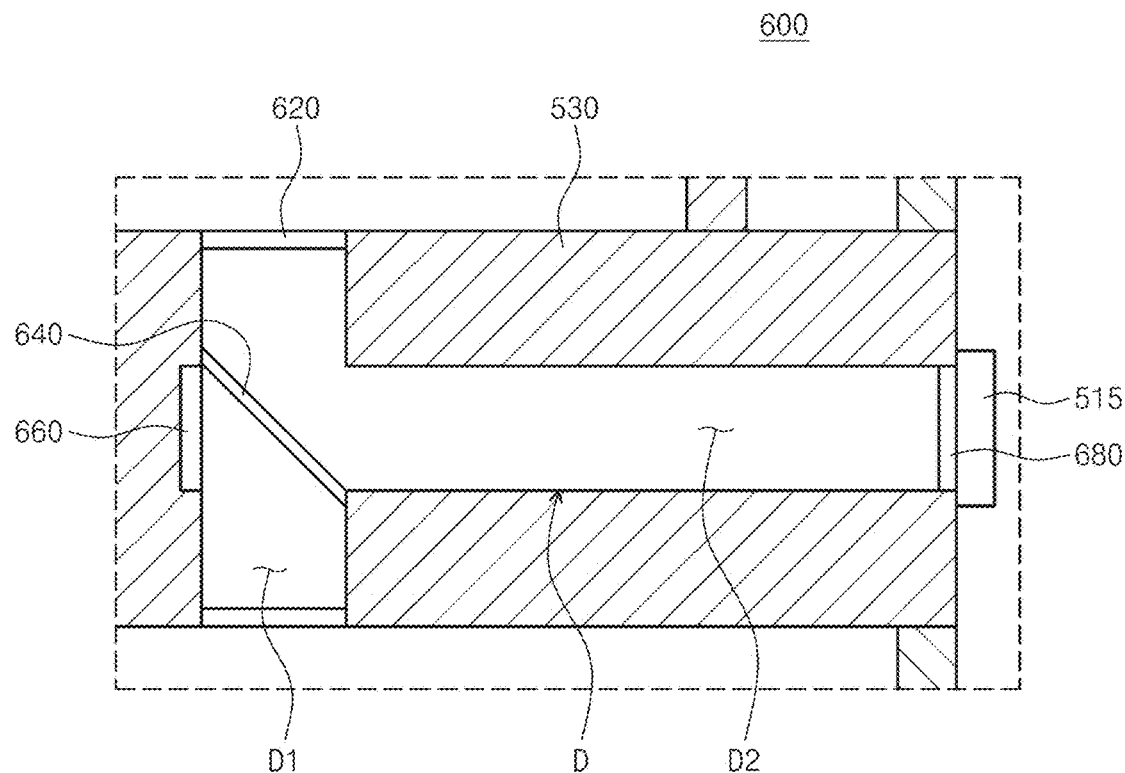
FIG. 3 schematically illustrates an embodiment of a monitoring unit of FIG. 2.

FIG. 3 schematically illustrates an embodiment of the monitoring unit of FIG. 2. Hereinafter, a monitoring unit according to an embodiment of the inventive concept will be described in detail with reference to FIG. 2 and FIG. 3.

The monitoring unit 600 observes characteristics of the plasma. In an embodiment, the monitoring unit 600 may analyze a light emitted from the plasma to observe the characteristics of the plasma. The monitoring unit 600 observes characteristics of the first plasma P1 generated in the plasma space A1. In addition, the monitoring unit 600 observes the characteristics of the second plasma P2 generated in the treating space A2.

The monitoring unit 600 is installed on the plate 830. The monitoring unit 600 may be installed outside the plate 830. In an embodiment, the monitoring unit 600 may be installed in a region far from a center of the plate 830 having a relatively low influence of an electric field by the plasma. The monitoring unit 600 is installed on the optical path D formed on the plate 830. The monitoring unit 600 is installed at a position which does not overlap the through hole 532 formed in the plate 830. In addition, the optical path D is formed not to overlap the through hole 532.

The optical path D may be connected to the plasma space A1. The optical path D may be connected to the treating space D2. The optical path D may be connected to the monitoring unit 600. The optical path D may be formed to penetrate a sidewall of the housing 510. The optical path D may be connected to a view port 515 installed on a side wall of the housing 510.

The optical path D may include a first path D1 and a second path D2. The first path D1 may be formed to penetrate the plate 830 in the vertical direction. For example, the first path D1 may be formed in a vertical direction penetrating a top end and a bottom end of the plate 830. The second path D2 extends from the first path D1. The second path D2 may extend from the first path D1 to be connected to the view port 515. For example, the second path D2 may be formed to be horizontal with respect to the first path D1. Unlike the above-described example, path directions of the first path D1 and the second path D2 may be formed by being modified into various paths.

The monitoring unit 600 may include a transparent cover 620, a polarizing plate 640, a refracting member 660, and a light receiving member 680.

The transparent cover 620 is installed in the first path D1. The transparent cover 620 may be installed at a top end and a bottom end of the first path D1, respectively. The transparent cover 620 may be installed above the first path D1 closest to the plasma space A1 among the first paths D1. The transparent cover 620 may be installed below the first path D1 closest to the treating space A2 among the first paths D1. A first light L1 emitted from the first plasma P1 generated in the plasma space A1 is incident on the transparent cover 620 installed at the top end of the first path D1. A second light L2 emitted from the second plasma P2 generated in the treating space A2 is incident on the transparent cover 620 installed at the bottom end of the first path D1. The transparent cover 620 may be made of a transparent material so that the light may be incident.

The transparent cover 620 vacuum-shields an inside of the optical path D. The transparent cover 620 may be made of a material capable of minimizing an influence of ions. In addition, the transparent cover 620 may be made of a material capable of minimizing a chemical reaction. According to an embodiment, the transparent cover 620 may be made of a material made of a $Y_2O_3$. Accordingly, the transparent cover 620 protects the monitoring unit 600 provided inside the optical path D from the plasma space A1 and the treating space A2.

The polarizing plate 640 is installed inside the optical path D. The polarizing plate 640 is installed at a position where the first path D1 and the second path D2 intersect. The polarizing plate 640 has a polarization direction formed in a first direction. The polarizing plate 640 may pass a first polarization having a polarization in the first direction among polarization components of the light emitted from the plasma. The polarizing plate 640 may reflect second polarizations having a second direction different from the first direction among polarization components of light emitted from the plasma.

The polarizing plate 640 may be disposed to be inclined. The polarizing plate 640 is formed to be inclined with respect to the first path D1 at an angle capable of reflecting a second polarization having a second direction in a direction horizontal to the second path D2.

The refractive member 660 is installed inside the optical path D. The refractive member 660 is formed on a side of the second path D2 inside the optical path D. The refractive member 660 is installed at a point at which the first path D1 and the second path D2 cross each other. The refractive member 660 may be disposed adjacent to the first path D1 of the first path D1 and the second path D2 at a point at which the first path D1 and the second path D2 meet. In an embodiment, the refractive member 660 may be disposed on the first path D1 and on a virtual straight line connecting a path direction of the second path D2, farther from the second path D2 than the polarizing plate 640. That is, inside the optical path D, the refractive member 660, the polarizing plate 640, and the light receiving member 680 to be described later may be sequentially disposed in a direction away from the center of the plate 530.

The refractive member 660 reflects the light flowing inside the optical path D. For example, the refractive member 660 may reflect the light flowing in the optical path D in a direction toward the second path D2. In addition, the refractive member 660 may change the polarization component of the light flowing in the optical path D. For example, if the light incident on the refractive member 660 is assumed to be a second polarization having a second direction, a characteristic of the second polarization may be changed to correspond to the first direction of the first polarization through the refractive member 660. Accordingly, the light reflected from the refractive member 660 may pass through the polarizing plate 640 having the first direction and move toward the second path D2. A detailed mechanism for this will be described later with reference to FIG. 5 to FIG. 11.

The light receiving member 680 receives the light flowing inside the optical path D. The light receiving member 680 receives the light passing through the second path D2. The light receiving member 680 is installed inside the optical path D. The light receiving member 680 is installed inside the optical path D on the other side opposite to a side of the second path D2 in which the refractive member 660 is installed. For example, the light receiving member 680 is installed in the second path D2 at a position adjacent to a sidewall of the housing 510. The light received from the light receiving member 680 moves to the view port 515.

Figure 4:
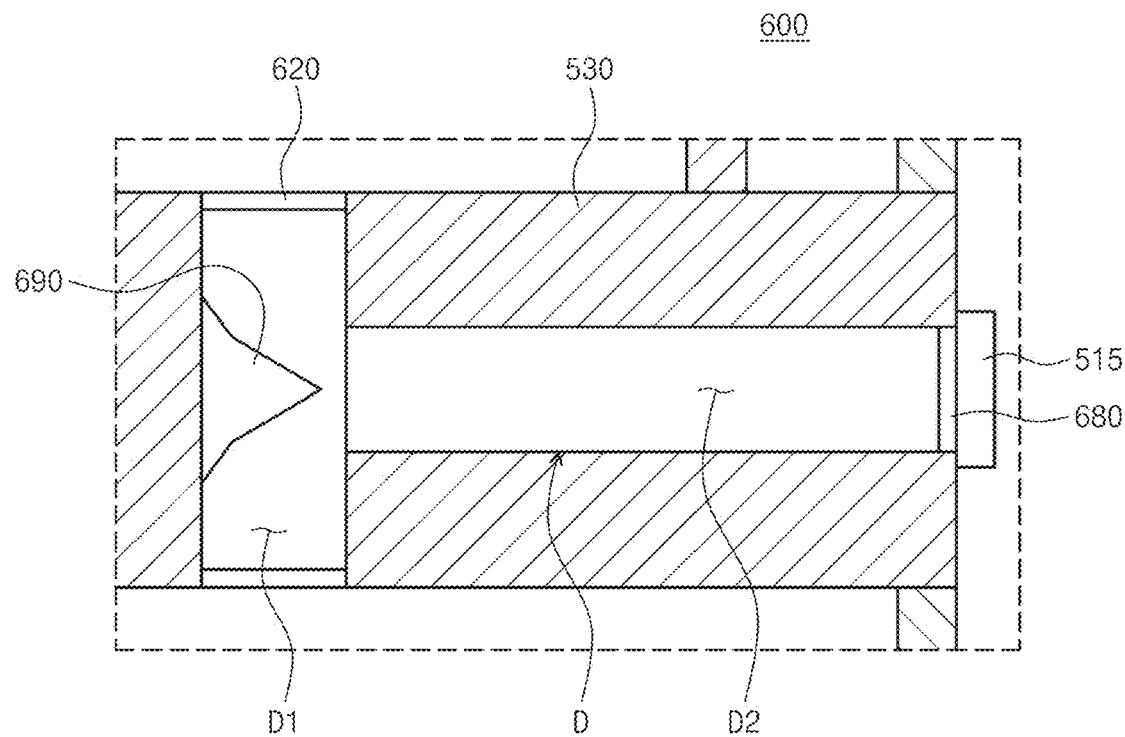
FIG. 4 schematically illustrates another embodiment of the monitoring unit of FIG. 2.

FIG. 4 schematically illustrates another embodiment of the monitoring unit of FIG. 2. The monitoring unit according to an embodiment of the inventive concept will be described in detail with reference to FIG. 4. Since the monitoring unit described below is mostly provided similar to the monitoring unit described with reference to FIG. 2 and FIG. 3, redundant descriptions will be omitted to prevent an overlapping of contents.

Referring to FIG. 4, the monitoring unit 600 may include a transparent cover 620, a light receiving member 680, and a reflective member 690. Since the transparent cover 620 and the light receiving member 680 are provided similarly to the configurations described with reference to FIG. 2 and FIG. 3, the reflective member 690 will be described in detail below.

The reflective member 690 is installed inside the optical path D. The reflective member 690 is provided with a material that reflects the light. The reflective member 690 may be installed in the first path D1. The reflective member 690 may be installed at a point at which the first path D1 and the second path D2 meet. For example, the reflective member 690 may be installed on a side of the first path D1 at a point at which the first path D1 and the second path D2 meet.

The reflective member 690 reflects the light incident into the first path D1 through the transparent cover 620 toward the second path D2. The reflective member 690 may be formed so that a top end and a bottom end are generally inclined. The top end of the reflective member 690 may be formed to be downwardly inclined toward the second path D2. An inclination of an inner part of the reflective member 690 adjacent to a side of the first path D1 may be greater than an inclination of the other side of the reflective member 690. Accordingly, the light emitted from the first plasma P1 incident above the first path D1 may flow to the view port 515 through the second path D2 by the reflective member 690.

The bottom end of the reflective member 690 may be formed to be upwardly inclined toward the second path D2. An inclination of the inner part of the reflective member 690 adjacent to a side of the first path D1 may be greater than an inclination of the other side of the reflective member 690. Accordingly, the light emitted from the second plasma P2 incident from the bottom part of the first path D1 may flow to the view port 515 through the second path D2 by the reflective member 690.

Figure 5:
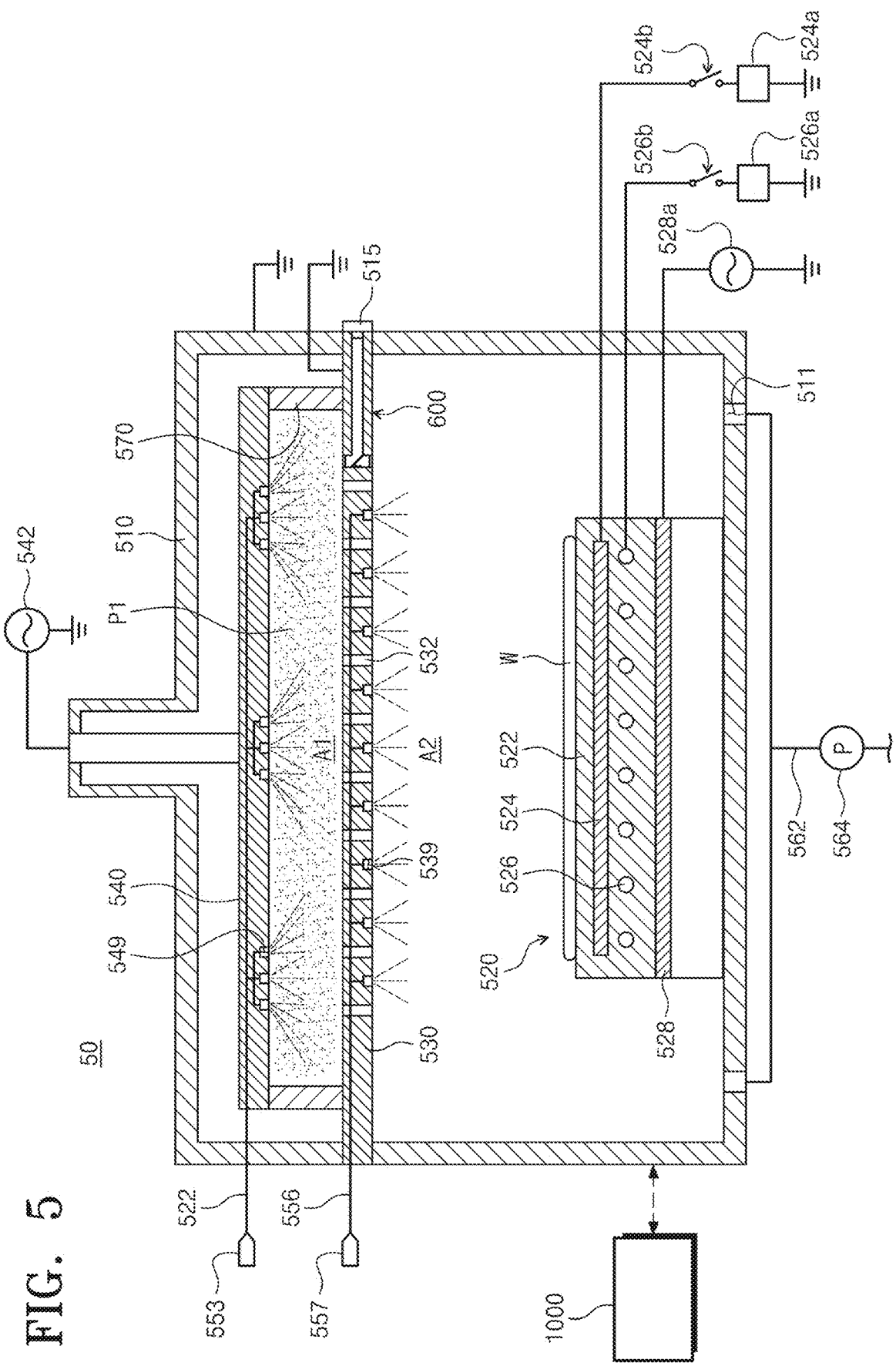
FIG. 5 schematically illustrates a first plasma treating step in the substrate treating method according to an embodiment of the inventive concept.

FIG. 5 schematically illustrates a first plasma treating step in a substrate treating method according to an embodiment of the inventive concept. Hereinafter, a first plasma treating step according to an embodiment of the inventive concept will be described in detail with reference to FIG. 5. The first plasma treating step S100 to be described below is not related to the second plasma treating step S200 to be described later. For convenience of description, the first plasma treating step S100 and the second plasma treating step S200 may be defined, and the second plasma treating step S200 may be performed after the first plasma treating step S100, the first plasma treating step S100 may be performed after the second plasma treating step S200, or the first plasma treating step S100 may be performed simultaneously with the first plasma treating step S200.

Referring to FIG. 5, the substrate treating method according to an embodiment of the inventive concept may perform the first plasma treating step S100. The first plasma treating step S100 is a step of treating the substrate W with a first plasma P1. In the first plasma treating step S100, the first gas supply unit 551 supplies a first gas G1 to the plasma space A1 through the first gas channel 549. The first gas G1 supplied to the plasma space A1 is excited to the first plasma P1 by the grounded plate 530 and the top electrode 540 to which the first high frequency power is applied. That is, as the first gas G1 is transferred to the first plasma P1, ions, electrons, and radicals are decomposed.

The first plasma P1 flows from the plasma space A1 to the treating space A2 through the through hole 532 of the plate 530. In the first plasma P1, ions and electrons in the components of the first plasma P1 are absorbed in the process of passing through the through hole 532. Accordingly, only radicals among the components included in the first plasma P1 flow into the treating space A2.

In addition, in the first plasma treating step S100, the second gas supply unit 555 supplies the second gas G2 to the treating space A2. The radicals moved to the treating space A2 are mixed with the second gas G2 supplied to the treating space A2 to generate a reaction gas in the treating space A2. The reaction gas may react with the substrate W positioned in the treating space A2 to remove a natural oxide layer of the substrate W. In an embodiment, a fluorine radical (F*) moved to the treating space A2 may be mixed with an $NH_3$ and/or an $H_2$, which is an embodiment of the second gas G2, to generate the reaction gas of an $NH_4F \cdot HF$ (ammonium hydrogen fluoride) and/or an $NH_4F$ (ammonium fluoride) in the treating space A2.

Figure 6:
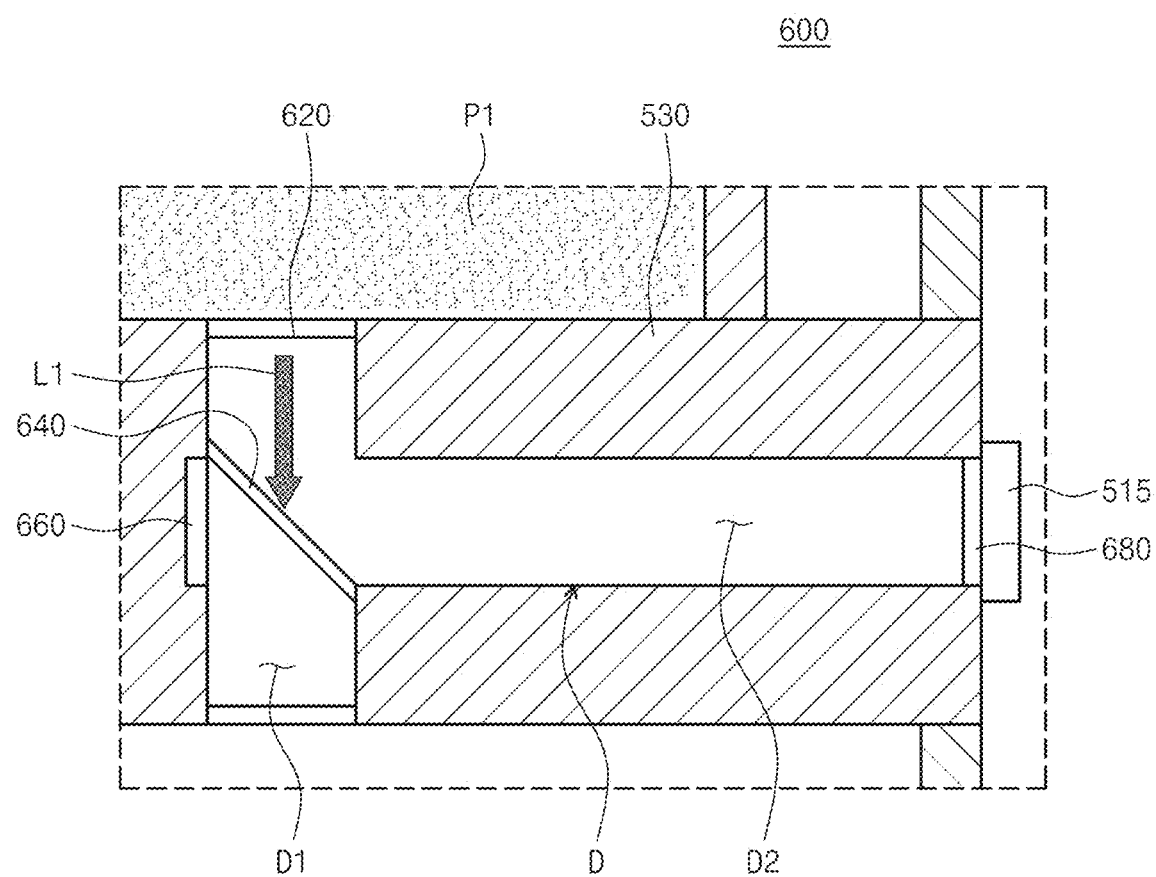
FIG. 6 illustrates a state in which a light emitted from a first plasma is incident on an optical path in the first plasma treating step of FIG. 5.
Figure 7:
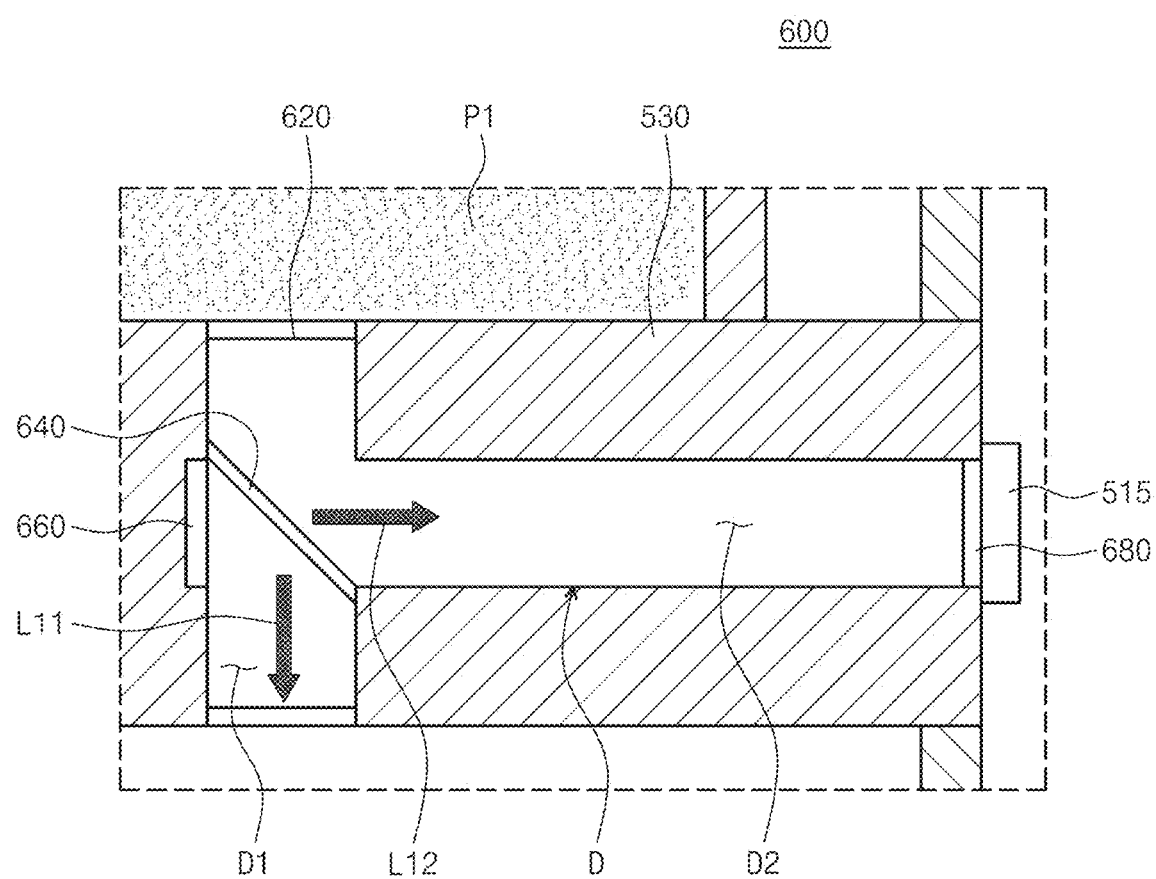
FIG. 7 schematically illustrates a state in which the light incident on the optical path of FIG. 6 flows inside the optical path.

FIG. 6 illustrates a state in which the light emitted from the first plasma is incident on the optical path in the first plasma treating step of FIG. 5. FIG. 7 schematically illustrates a state in which the light incident on the optical path of FIG. 6 flows inside the optical path. Hereinafter, a mechanism in which the light flowing inside an optical path moves to a view port by a monitoring unit will be described in detail with reference to FIG. 6 and FIG. 7.

As described above, the first gas G1 supplied by the first gas supply unit 551 to the plasma space A1 is excited to generate the first plasma P1 in the plasma space A1 by the plate 530 and the top electrode 540. The light emitted from the first plasma P1 is incident into the optical path D. Hereinafter, for convenience of description, the light emitted from the first plasma P1 is defined as a first light L1. In addition, the first light L1 is defined as consisting of a first polarization L11 vibrating in the first direction and a second polarization L12 vibrating in the second direction, which is different from the first direction. In addition, the polarizing plate 640 is defined as having the same direction as the first direction, which is a vibration direction of the first polarization L11.

Referring to FIGS. 6 and 7, the first light L1 is incident into the first path D1 through the transparent cover 620 installed at a top end of the first path D1. The first light L1 flows through the first path D1, and is incident on the polarizing plate 640 at a point at which the first path D1 and the second path D2 meet each other. The first light D1 incident on the polarizing plate 640 passes through the polarizing plate 640 in the first direction according to the polarizing direction in the first direction. Accordingly, the first polarization L11 flows from the top end to the bottom end of the first path D1. The first polarization L11 passes through the transparent cover 620 installed at the bottom end of the first path D1 and exits to the treating space A2.

In addition, among the first light L1 incident on the polarizing plate 640, the second polarization L12 having a component in the second direction is reflected from the polarizing plate 640 according to a polarization direction in the first direction formed on the polarizing plate 640. Since the polarizing plate 640 is formed to be inclined so that light incident on the first path D1 is directed toward the second path D2, the reflected second polarization L12 flows toward the second path D2. The second polarization L12 incident on the second path D2 is incident on the view port 515, and the operator can observe the characteristics of the first plasma P1 through the view port 515.

Figure 8:
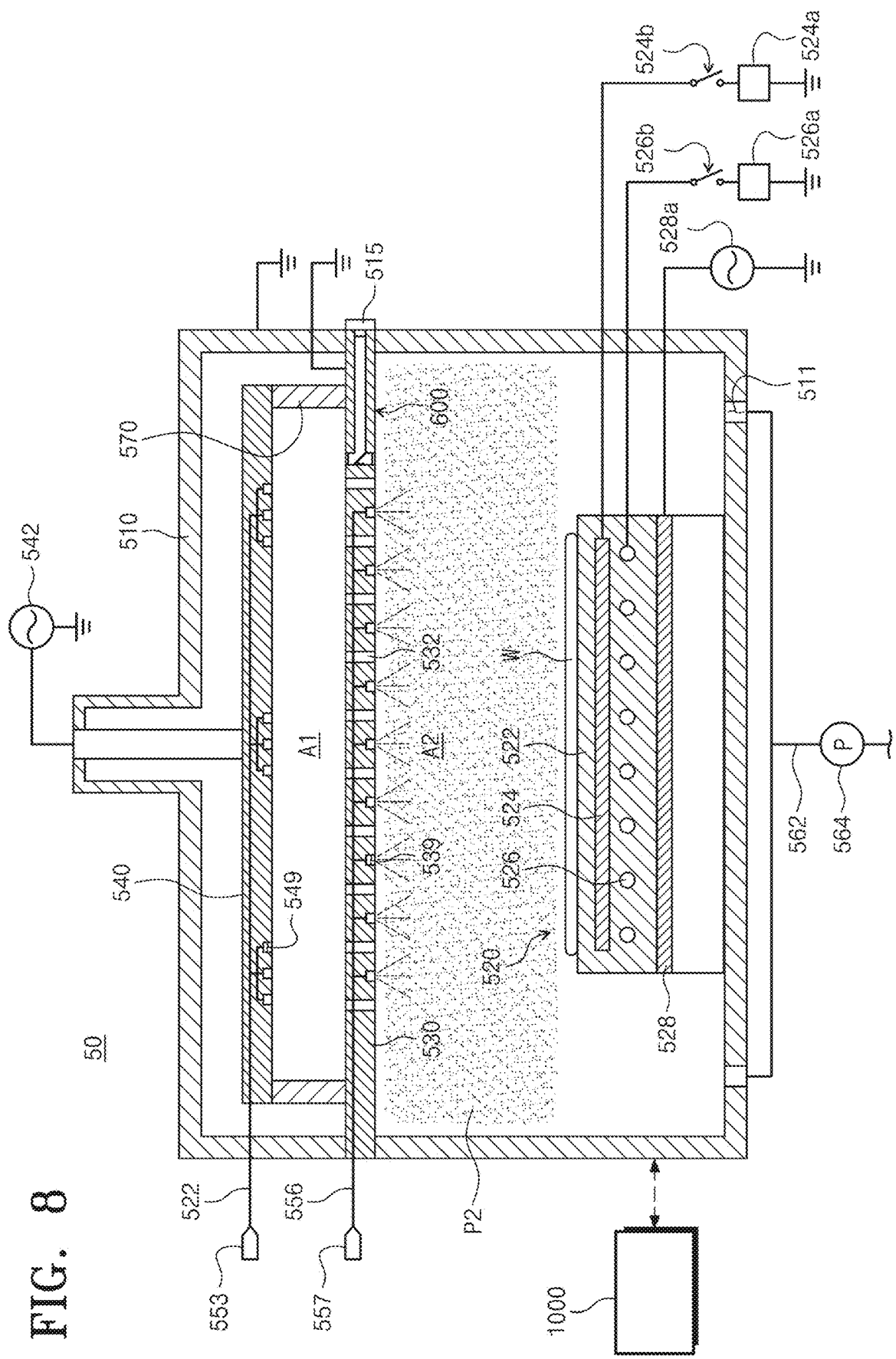
FIG. 8 schematically illustrates a second plasma treating step in the substrate treating method according to an embodiment of the inventive concept.

FIG. 8 schematically illustrates a second plasma treating step in the substrate treating method according to an embodiment of the inventive concept. The second plasma treating step S200 according to an embodiment of the inventive concept is a step of treating the substrate W with the second plasma P2. In the second plasma treating step S200, the second gas supply unit 555 supplies the second gas G2 to the treating space A2 through the second gas channel 539. The second gas G2 supplied to the treating space A2 is excited to the second plasma P2 by the grounded plate 530 and the bottom electrode 528 to which the second high frequency power is applied. The second plasma P2 flowing through the treating space A2 may act on the substrate W. The second plasma P2 acting on the substrate W may contribute to a surface modification of the substrate. In an embodiment, the H ions included in the second plasma P2 may weaken a bond between an Si and an O formed in the substrate W.

Figure 9:
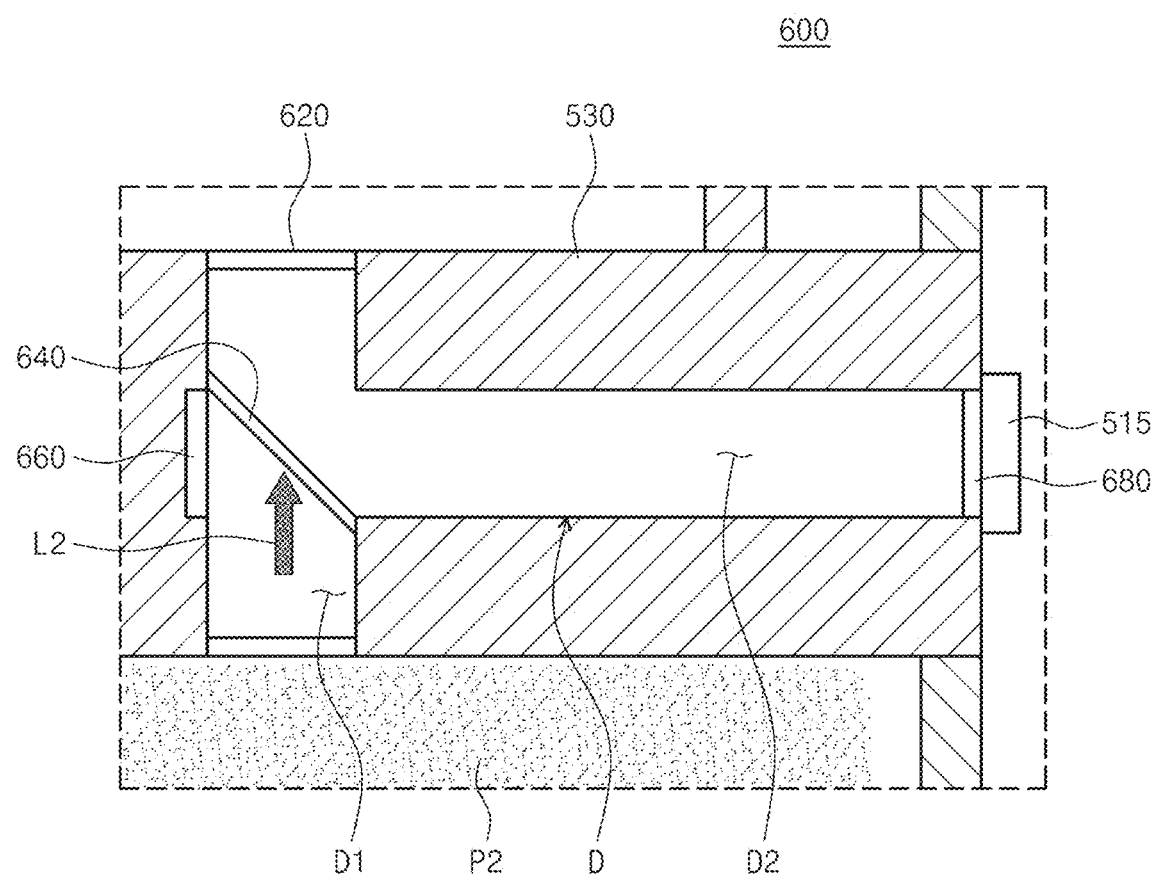
FIG. 9 illustrates a state in which a light emitted from a second plasma is incident on an optical path in the second plasma treating step of FIG. 8.
Figure 10:
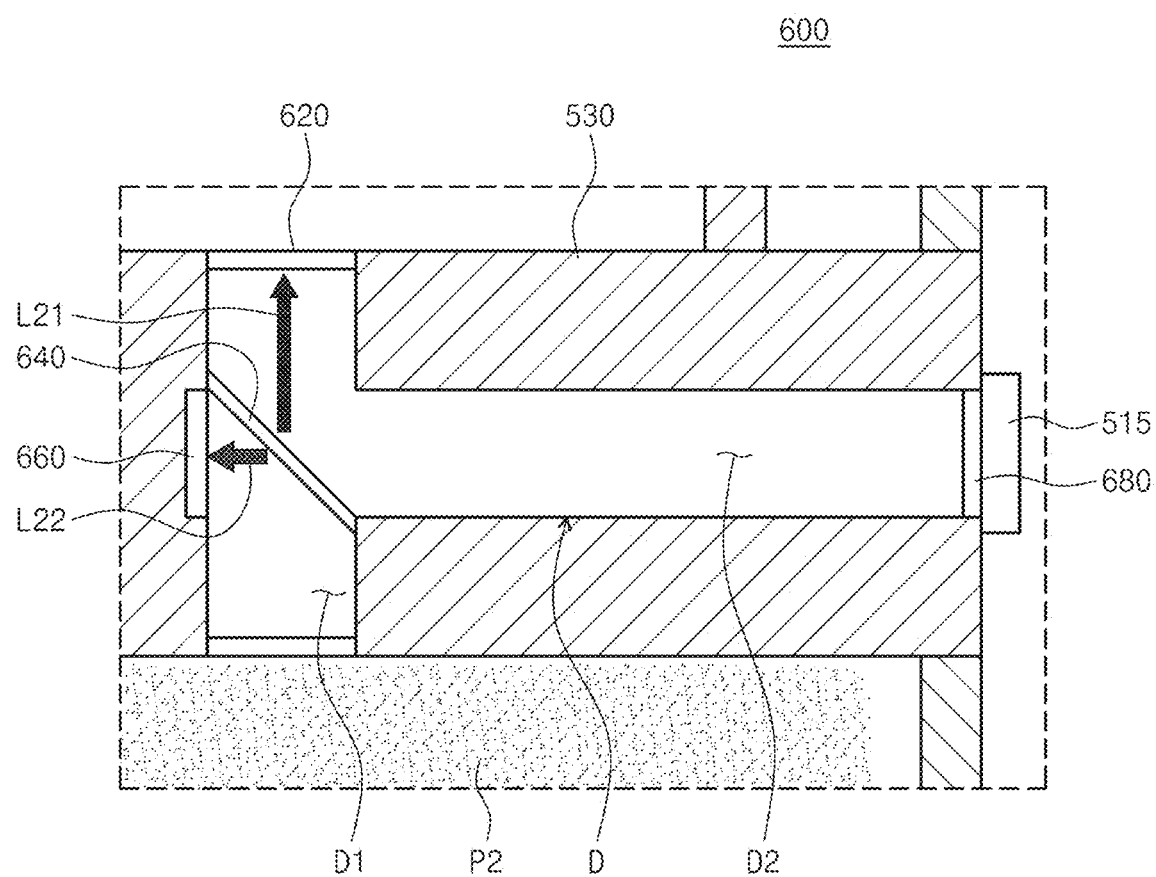
FIG. 10 schematically illustrates a state in which a light incident on the optical path of FIG. 9 flows inside the optical path.
Figure 11:
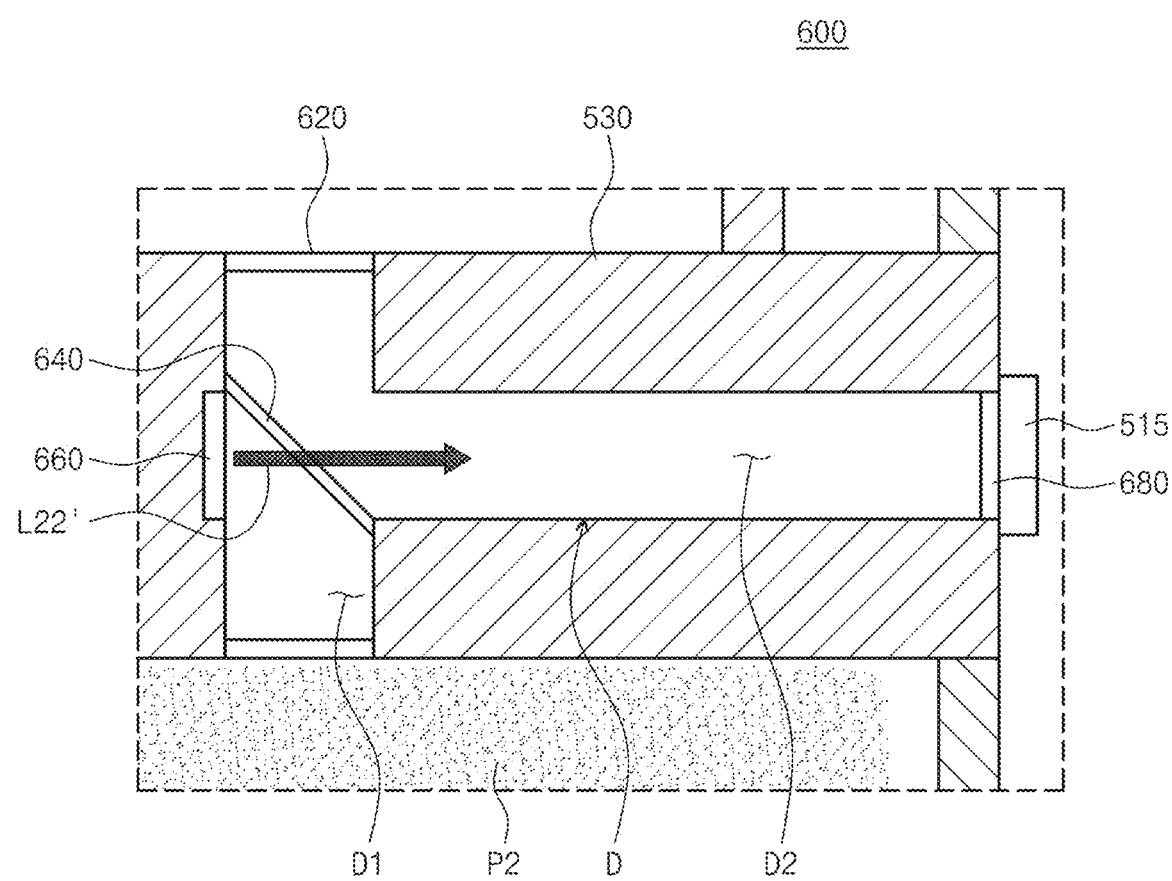
FIG. 11 schematically illustrates a shape of the light flowing in the second path by changing a direction of a polarization and the optical path by a refractive member among the light flowing in the optical path of FIG. 10.

FIG. 9 illustrates a state in which the light emitted from the second plasma is incident on the optical path in the second plasma treating step of FIG. 8. FIG. 10 schematically illustrates a state in which the light incident on the optical path of FIG. 9 flows inside the optical path. FIG. 11 is a view schematically showing a shape of light flowing in the second path by changing a direction of polarization and the optical path by a refractive member among the light flowing in the optical path of FIG. 10.

As described above, the second gas G2 supplied by the second gas supply unit 555 to the treating space A2 is excited to generate the second plasma P2 in the treating space A2 by the plate 530 and the bottom electrode 528. The light emitted from the second plasma P2 is incident into the optical path D. Hereinafter, for convenience of description, the light emitted from the second plasma P2 is defined as the second light L2. In addition, the first light L2 is defined as consisting of a first polarization L21 vibrating in the first direction and a second polarization L22 vibrating in the second direction, which is different from the first direction. In addition, the polarizing plate 640 is defined as having the same direction as the first direction, which is the vibration direction of the first polarization L21.

Referring to FIGS. 9 and 10, the second light L2 is incident into the first path D1 through the transparent cover 620 installed at the bottom end of the first path D1. The second light L2 flows through the first path D1, and is incident on the polarizing plate 640 at a point at which the first path D1 and the second path D2 meet each other. The second light L2 incident on the polarizing plate 640 passes through the polarizing plate 640 along the polarizing direction in the first direction, and the first polarization L21 having a component in the first direction passes through the polarizing plate 640. Accordingly, the first polarization L21 flows from a bottom end to a top end of the first path D1. The first polarization L21 passes through the transparent cover 620 installed on the top end of the first path D1 and exits to the plasma space A1.

Referring to FIG. 10 and FIG. 11, among the second light L2 incident on the polarizing plate 640, the second polarization L22 having a component in the second direction is reflected from the polarizing plate 640 in the first direction. Since the polarizing plate 640 is inclined so that the light incident from the top of the first path D1 toward the bottom of the second path D2, the second polarizing wave L22 having a second direction component incident from the bottom of the first path D1 is reflected from the polarizing plate 640 toward the refracting member 660. The second polarization L22 incident on the refractive member 660 changes the characteristics of the polarization so as to vibrate in the first direction by the refractive member 660. The second polarization L22" in which the characteristics (wavelength or vibration) of the polarization are changed flows from the refractive member 660 toward the second path D2. Accordingly, the second polarization L22' whose polarization characteristics have changed is incident on the view port 515 through the second path D2, and the operator can observe the characteristics of the second plasma P2 through the view port 515.

According to an embodiment of the inventive concept described above, by installing the monitoring unit 600 capable of observing the plasma on the plate 530, the first plasma P1 generated above the plate 530 and the second plasma P2 generated from below the plate 530 may be observed by the monitoring unit 600. Accordingly, it is possible to realize an effect of observing a plurality of plasma generated at different positions with different characteristics.

In addition, according to one embodiment of the inventive concept, by placing the monitoring unit 600 inside the plate 530 which is relatively less affected by the electric field, it is possible to minimize an interference of an observing of the plasma due to a deposition of process by-products or particles on the monitoring unit 600. In addition, since the optical path D in which the monitoring unit 600 is formed is sealed by the transparent cover 620, the plasma can be prevented from penetrating the optical path D, thereby forming an environment in which the plasma can be observed efficiently.

In addition, according to an embodiment of the inventive concept, by forming the optical path D inside an existing plate 530 and placing the monitoring unit 600 for observing the plasma on the optical path D, multiple plasma having different characteristics can be observed without additional structural changes. Accordingly, it is possible to increase an efficiency of a substrate W treatment due to a change in the characteristics of the plasma.

In an embodiment of the inventive concept described above, it has been described that the polarizing plate 640 is formed to be downwardly inclined toward the second path D2, but is not limited thereto. In an embodiment, the polarizing plate 640 may be formed to be upwardly inclined toward the second path D2. In this case, a mechanism of observing the characteristics of the first plasma P1 in the mechanism of the monitoring unit 600 may be changed to a mechanism of observing the characteristics of the second plasma P2, and the mechanism of the monitoring unit 600 may be changed to a mechanism of observing the characteristics of the first plasma P1.

In addition, according to an embodiment of the inventive concept described above, the monitoring unit 600 includes a light receiving member 680, but the light incident on the second path D2 can immediately move to the view port 515 through the sidewall of the housing 510.

Figure 12:
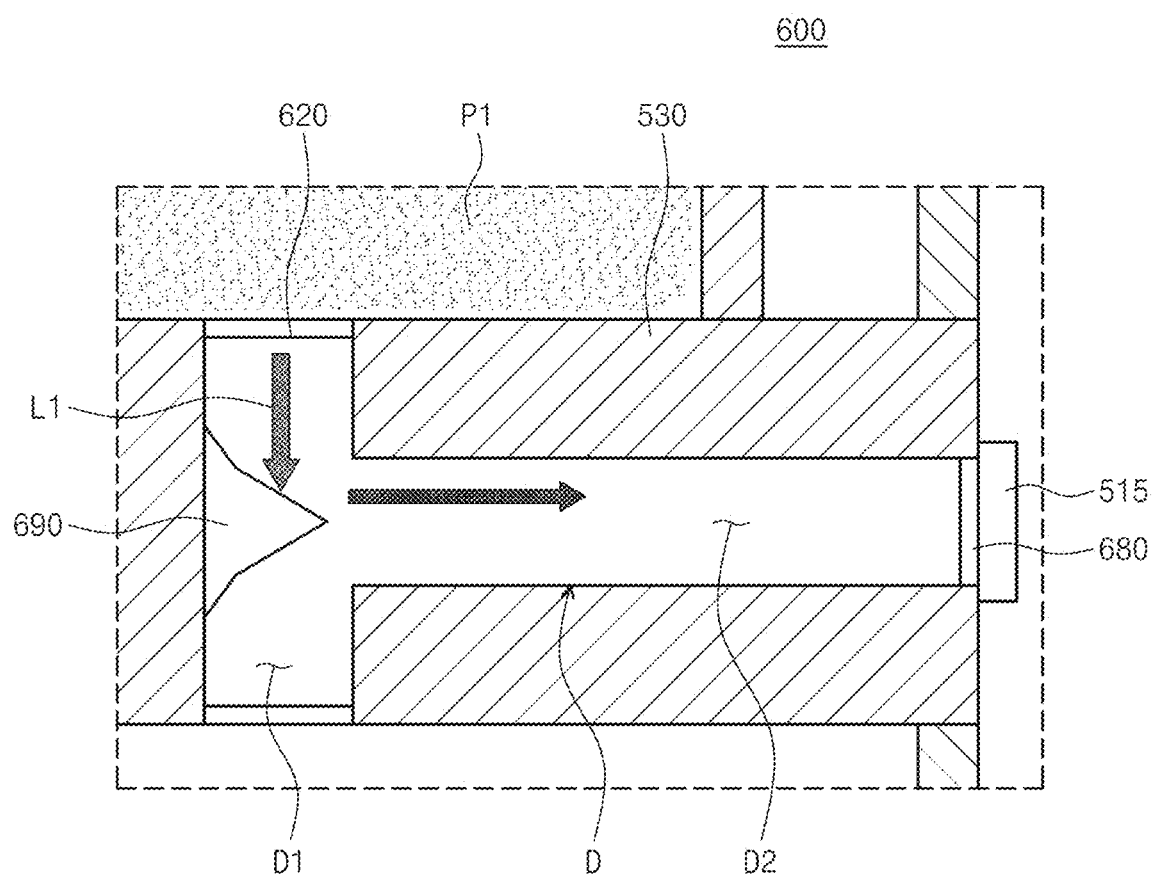
FIG. 12 schematically illustrates a state in which the light emitted from the first plasma by the monitoring unit of FIG. 4 flows inside the optical path.
Figure 13:
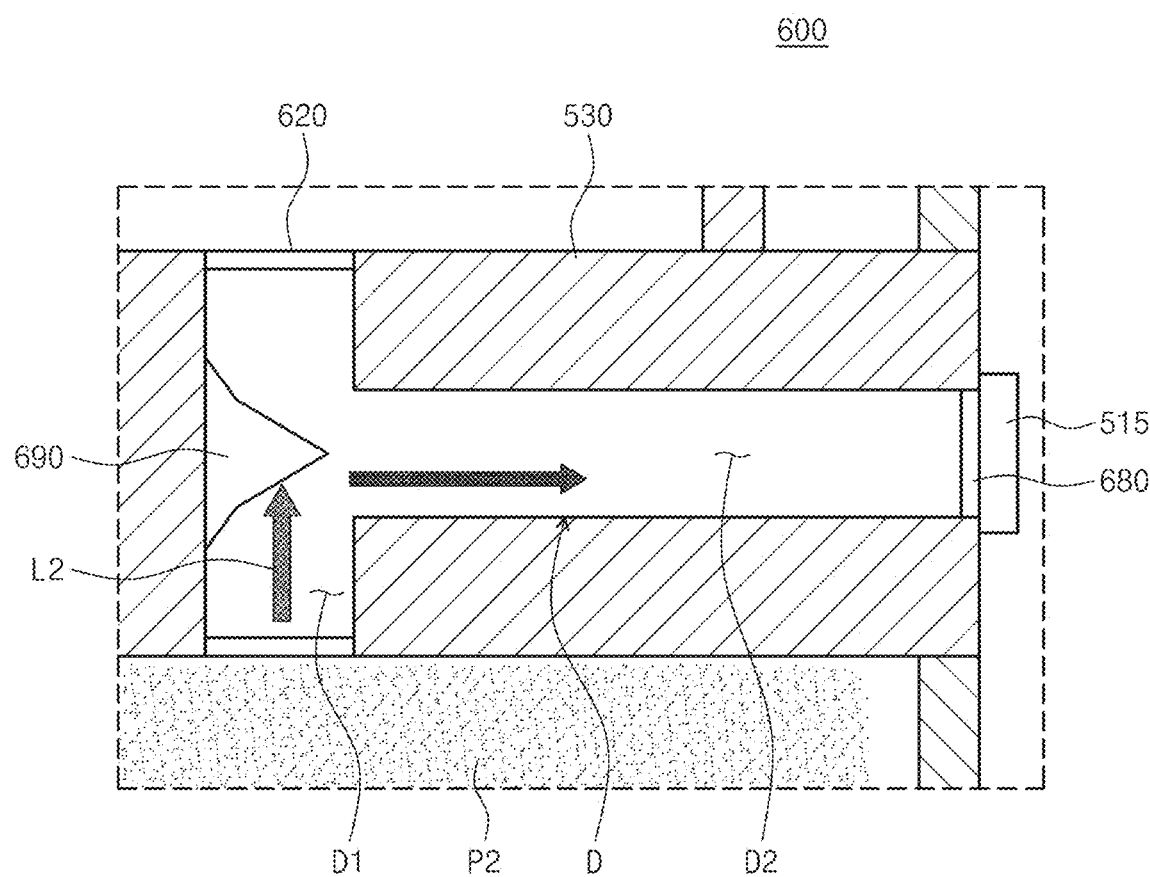
FIG. 13 schematically illustrates a state in which the light emitted from the second plasma by the monitoring unit of FIG. 4 flows inside the optical path.

FIG. 12 schematically illustrates a state in which the light emitted from the first plasma flows inside an optical path by the monitoring unit of FIG. 4. FIG. 13 schematically illustrates a state in which the light emitted from the second plasma flows inside the optical path by the monitoring unit of FIG. 4. Hereinafter, a plasma observation mechanism by the monitoring unit of FIG. 4 will be described in detail with reference to FIG. 12 and FIG. 13.

Referring to FIG. 12, the first light L1 emitted from the first plasma P1 in the plasma space A1 passes through the transparent cover 620 and is incident into the first path D1. The first light L1 incident on the first path D1 reaches the reflective member 690 provided at a point at which the first path D1 and the second path D2 intersect each other. The first light L1 is incident on a top end of the reflective member 690 and is reflected to the second path D2. The first light L1 reflected by the second path D2 is incident on the view port 515 through the second path D2. Accordingly, the operator may observe the characteristics of the first plasma P1 generated in the plasma space A1 from the first light L1.

Referring to FIG. 13, the second light L2 emitted from the second plasma P2 in the treating space A2 is incident into the first path D1 via the transparent cover 620. The second light L2 incident on the second path D2 reaches the reflective member 690 provided at a point at which the first path D1 and the second path D2 intersect each other. The second light L2 is incident on a bottom end of the reflective member 690 and reflected to the second path D2. The second light L2 reflected by the second path D2 is incident on the view port 515 through the second path D2. Accordingly, the operator may observe the characteristics of the second plasma P2 generated in the treating space A2 from the second light L2.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising: a housing having an inner space; a plate separating the inner space into a first space which is above and a second space which is below and having a plurality of through holes; a first gas supply unit configured to supply a first gas to the first space; a plasma source for generating a plasma at the first space or the second space; and a monitoring unit installed at the plate and configured to monitor a characteristic of the plasma generated at the first space or the second space; wherein an optical path connecting the first space or the second space, and the monitoring unit is formed at the plate; and wherein the plasma source comprises: a first electrode applied with a first high frequency power and generating a first plasma at the first space; and a second electrode applied with a second high frequency power and generating a second plasma at the second space, and wherein the optical path has a first path which penetrates the plate in an up/down direction and a second path which connects to the first path and extends in a direction toward a side wall of the plate.

2. The substrate treating apparatus of claim 1, wherein the monitoring unit includes a polarizing plate installed at a position at which the first path and the second path intersect, and which has a polarization direction in a first direction, the light includes a first polarization which vibrates in the first direction and a second polarization which vibrates in a second direction which is different from the first direction, and the polarization plate is formed inclined with respect to the first path so the second polarization among the light incident to the first path is reflected from the polarizing plate to face a direction parallel to the second path.

3. The substrate treating apparatus of claim 2, wherein the monitoring unit further comprises: a receiving member installed at a side of the second path which is adjacent to the side wall and which receives the light; and a refraction member installed at the other side facing a side of the second path and which changes a characteristic of the second polarization so the second polarization which is reflected from the polarizing plate vibrates in the first direction.

4. The substrate treating apparatus of claim 1, wherein the monitoring unit further includes a reflective member installed on the first path and which reflects the light which is incident from the first path to the second path.

5. The substrate treating apparatus of claim 1, wherein a transparent cover is further installed at each of an end and the other end of the first path at the monitoring unit.

6. The substrate treating apparatus of claim 1, wherein the plate is grounded and captures ions included in a plasma generated in the first space to supply radicals to the second space.

7. A substrate treating apparatus comprising: a housing having a plasma region and a substrate treating region; a plate separating the plasma region and the substrate treating region and having a plurality of through holes; a first gas supply unit configured to supply a gas to the plasma region; a plasma source for generating a plasma at the plasma region; and a monitoring unit installed at the plate and configured to monitor a characteristic of the plasma generated at the plasma region; wherein an optical path is formed connecting the plasma region or the substrate treating region, and the monitoring unit at the plate; and wherein the optical path has a first path which penetrates the plate in an up/down direction and a second path which connects to the first path and extends in a direction toward a side wall of the plate.

8. The substrate treating apparatus of claim 7, wherein the monitoring unit includes a polarizing plate installed at a position at which the first path and the second path intersect, and which has a polarization direction in a first direction, the light includes a first polarization which vibrates in the first direction and a second polarization which vibrates in a second direction which is different from the first direction, and the polarization plate is formed inclined with respect to the first path so the second polarization among the light incident to the first path is reflected from the polarizing plate to face a direction parallel to the second path.

9. The substrate treating apparatus of claim 7, wherein the monitoring unit includes a reflective member plate installed at a position at which the first path and the second path intersect, and which reflects the light incident to the first path in a direction of the second path.

10. The substrate treating apparatus of claim 7, wherein a transparent cover is further installed at each of an end and the other end of the first path at the monitoring unit.

11. The substrate treating apparatus of claim 7, wherein the monitoring unit further comprises: a receiving member installed at a side of the second path which is adjacent to the side wall and which receives the light; and a refraction member installed at the other side facing a side of the second path and which changes a characteristic of the second polarization so the second polarization which is reflected from the polarizing plate vibrates in the first direction.

12. A substrate treating apparatus comprising: a housing having a treating space; an ion blocker dividing the treating space and a plasma space and which is grounded; a first gas supply unit configured to supply a first gas to the treating space; a second gas supply unit configured to supply a second gas to the plasma space; a top electrode positioned above the ion blocker and facing the ion blocker, which connects with a top source to be applied with a high frequency power, and which excites a first gas to generate a first plasma at a plasma space; a bottom electrode positioned below the ion blocker and facing the ion blocker, which excites the second gas to generate a second plasma at the treating space; and a monitoring unit configured to monitor a characteristic of the first plasma generated at the treating space and/or the second plasma generated at the plasma space, and wherein the monitoring unit is installed at the ion blocker, an optical path which connects the treating space or the plasma space, and the monitoring unit is formed at the ion blocker, and the optical path has a first path which penetrates the ion blocker in an up/down direction and a second path which connects to the first path and extends in a direction toward a side wall of the ion blocker.

13. The substrate treating apparatus of claim 12, wherein the monitoring unit includes a polarizing plate installed at a position at which the first path and the second path intersect, and which has a polarization direction in a first direction, the light includes a first polarization which vibrates in the first direction and a second polarization which vibrates in a second direction which is different from the first direction, and the polarization plate is formed inclined with respect to the first path so the second polarization among the light incident to the first path is reflected from the polarizing plate to face a direction parallel to the second path.

14. The substrate treating apparatus of claim 12, wherein the monitoring unit further includes a reflective member installed on the first path and which reflects the light which is incident from the first path to the second path.

* * * * *